United States Patent [19]

Sterling et al.

[11] 4,199,415

[45] Apr. 22, 1980

[54] SELECTIVE PLATING PROCESS

[75] Inventors: Henley F. Sterling, Great Dunmow; Richard A. Humphreys, Harlow, both of England

[73] Assignee: ITT Industries, Incorporated, New York, N.Y.

[21] Appl. No.: 24,583

[22] Filed: Mar. 28, 1979

[30] Foreign Application Priority Data

Apr. 11, 1978 [GB] United Kingdom ............... 14118/78

[51] Int. Cl.² ............................................. C25D 5/02
[52] U.S. Cl. .................................................. 204/15
[58] Field of Search ......................................... 204/15

[56] References Cited

FOREIGN PATENT DOCUMENTS 1194826  6/1970  United Kingdom .

Primary Examiner—T. M. Tufariello
Attorney, Agent, or Firm—Thomas L. Peterson

[57] ABSTRACT

A method of selective plating, e.g. of gold on phosphor bronze, includes the steps of printing on the phosphor-bronze a mask which defines the area to be plated, electro-painting the unmasked areas in an electrolytic bath with an epoxy-phenolic paint, stoving the material so that the epoxy coat becomes a strongly adherent and chemically resistant layer, removing the mask produced in the first step in a suitable solvent, leaving the metal to be plated bare, and electro-plating. The epoxy coating may be left in situ or removed.

1 Claim, No Drawings

SELECTIVE PLATING PROCESS

BACKGROUND OF THE INVENTION

This invention relates to the selective plating of metal parts with a precious metal.

In the manufacture of electrical contacts and contact springs, as used in electrical connectors and relays, it is usual to coat the contact-making areas of the contacts and contact springs with a precious metal, because of the good contact-making properties of such metals. Since these metals are expensive, it is highly desirable to use as little as possible of such materials. Hence, an object of the present invention is to provide a selective plating method which enables the areas of plating to be reduced to that needed for the actual contact-making function.

SUMMARY OF THE INVENTION

According to the principal aspect of the present invention, there is provided a method of selective plating of a metal surface with a precious metal, which includes the steps of producing a removable mask on a metal surface to be plated, which mask covers the area to be plated, electro-painting the metal surface in an electrolytic bath with an organic resin paint, said paint covering the portion or portions of the metal surface not covered by said removable mask, removing the removable mask so as to leave the area to be plated with the precious metal un-masked, and electro-plating the un-masked area of the metal surface with the precious metal.

DESCRIPTION OF THE PREFERRED EMBODIMENTS

The most used contact making metal is gold, which provides a corrosion-resistant connection of low electrical resistance when the elements plated therewith are metal. Hence, in the succeeding description the emphasis is on selective plating with gold, although other metals could be used.

The invention will now be described with specific reference to the manufacture of electrical contacts from thin phosphor bronze, beryllium copper or other metal of which the contact making regions are to be gold plated. In the conventional method of manufacture, the contact strips are punched and formed, and then barrel plated electrolytically over their entire surface, which is uneconomical.

In our process, the first step involves printing the base metal strip with suitable medium, the printed areas coinciding with those areas where the gold plating is required. The composition of this medium is not critical, and may be based on a variety of materials common in paints, varnishes, glues and inks. However, it must be compatible with a printing process, e.g., silk screen, roller. In addition, it should have properties which tend to be antagonistic to the medium used in the second step, below.

In the second stage, the printed strip is made the anode in an electro-painting bath containing a second medium, which is formulated as for the well-known electro-plating process using an organic base. When an electrical potential is applied, deposition of the paint, an organic polymer, for example an epoxy-phenolic resin, takes place. This deposition only occurs on the exposed metal, and not on the areas masked in the first step, no deposition occuring on that mask because it is an electrical insulator. This resin layer is "electro-plated" onto the metal surface by a complex process based on electro-osmosis and electro-phoresis. Further information on electro-painting can be obtained from the book, "Electro-painting" by R. L. Yeates, published in 1966 by Robert Draper Ltd.

After the electro-painting operation, the strip is passed through a water rinse.

In the third stage, the strip is passed through an oven which is heated to a temperature in the range of 100° C. to 250° C., to stove and cure the second medium to give a thin coating which can be mechanically deformed without flaking off, and is highly chemically resistant, especially to the chemical mixes normally found in electro-plating processes.

In the fourth stage, the strip is passed into a solvent bath to remove the mask of the first medium, suitable solvents being acetone and methylethylketone. This removes the first medium leaving bare substrate metal exposed, but only in the area or areas on which the precious metal coating is required.

In the fifth stage, the treated strip, which is coated with the cured second medium in the areas other than those to be plated, is formed and stamped to the desired shape.

Now the mechanically-formed strip passes into the gold electro-plating sequence, in which it forms the cathode in a gold plating bath. Hence, the gold is deposited only on the areas which were printed with the first medium.

To consider the first medium again, cellulose varnishes have been found to be satisfactory, and they can be removed during the fourth stage by the use of suitable thinners. It is also possible to produce a volatile first medium, which evaporates, depolymerizes during the third stage (stoving the electro-paint) in which case stage four is not needed.

We now consider two examples of application of our method of selective electroplating.

EXAMPLE 1

The material to be selectively plated was phosphor-bronze strip 0.010 inch thick, on which ⅛ inch diameter gold circles were to be plated.

In a preliminary stage, the phosphor-bronze strip was treated in a Watts bath to produce a nickel layer 2 μm thick, this being to British Standard Specification BS 1224.

Next the strip was printed with ⅛ inch circles using a silk screen process, with an ink based on cellulose lacquer.

The printed strip was next treated anodically in an electro-painting medium, based on a cross-linked epoxy type resin, the actual material used being one sold by Ault and Wiborg Paints Ltd. under their code ME1103/0, this being a clear electro-coating varnish. The treatment was at 60 volts potential for two minutes.

The strip was then washed in distilled water, dried, and stoved (curved) at 192° C. for 15 minutes, to produce the firm coating referred to above. Then the cellulose, i.e., the original mask of the first medium, was removed in a toluene solvent bath.

Then the strip was cleaned and prepared for the electroplating. This latter involved gold plating in Autronet CC (Sel Rex) plating solution at 1 amp per dm$^2$, according to the manufacturer's instructions to give a thickness of gold on the now unmasked areas of 5 μm.

Finally the plated strip was cleaned, dried, and subjected to such further mechanical treatment as was needed.

EXAMPLE 2

Here the material to be treated was contact fingers on a carrier strip, made of a nickel silver base metal.

The first stage, i.e., the production of the removable mask, consisted of printing, e.g. by the same method as that used in Example 1, a strip of an acrylic-based paint onto the contact area of each finger on which gold was required.

The electro-painting process involved treating the material anodically in an electro-coating bath using grey epoxy Electrocoat enamel, sold under the code ME1074/1, diluted with between its own volume and three times its own volume with demineralized water. The treatment was effected at 50 volts for 3 minutes.

The electro-painted fingers were then washed in distilled water, dried and stoved at 185° C. for 28 minutes. Thereafter, the acrylic paint was removed in xylene, using an ultrasonic bath to assist cleaning.

The above was followed by cleaning and preparing for gold plating, which was done using Engold 86HE (sold by Engelhard Ltd.) to the manufacturer's instructions, to produce a thickness of 3 μm.

In the arrangements described above, the electro-painted mask is made from epoxy-phenolic resin materials, but many other organic varnish materials which are capable of being made into electro-painting media can be used. Examples which are worthy of mention are epoxy-melamine and polyurethane. The important point is that the electro-paint masking should be effective during the electro-plating step. In some cases, it may be considered desirable to remove the mask when the electro-plating has been completed. In such case, the stoving step would be omitted from the process.

What is claimed is:

1. A method of selective plating of a metal surface with a precious metal comprising the steps of:

producing a removable mask on a metal surface to be plated, which mask covers the area to be plated, said mask being formed of a volatile material;

electro-painting the metal surface in an electrolytic bath with an organic resin paint, said paint covering the portion or portions of the metal surface not covered by said removable mask;

heating the coating of paint to simultaneously stove and cure the paint and remove said mask of volatile material so as to leave the area to be plated with the precious metal un-masked; and electro-plating the un-masked area of the metal surface with the precious metal.

* * * * *